US 006611936B2

(12) United States Patent
Jue et al.

(10) Patent No.: US 6,611,936 B2
(45) Date of Patent: Aug. 26, 2003

(54) PROGRAMMABLE DELAY ELEMENTS FOR SOURCE SYNCHRONOUS LINK FUNCTION DESIGN VERIFICATION THROUGH SIMULATION

(75) Inventors: Darren S. Jue, Sunnyvale, CA (US); Ashish Gupta, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/560,191

(22) Filed: Apr. 28, 2000

(65) Prior Publication Data

US 2003/0106005 A1 Jun. 5, 2003

(51) Int. Cl.[7] .................. G01R 31/28; G01R 11/00; G06F 17/50; G06F 9/455
(52) U.S. Cl. ................. 714/741; 714/33; 703/14; 703/28; 716/4
(58) Field of Search ................. 714/724, 725, 714/741, 33; 703/14, 16, 28; 716/4, 5, 6

(56) References Cited

U.S. PATENT DOCUMENTS

| 5,633,813 | A | * | 5/1997 | Srinivasan | 703/14 |
|---|---|---|---|---|---|
| 5,740,086 | A | * | 4/1998 | Komoto | 702/120 |
| 5,841,789 | A | * | 11/1998 | McClure | 714/724 |
| 5,862,361 | A | * | 1/1999 | Jain | 703/16 |
| 5,930,482 | A | | 7/1999 | Carter et al. | |
| 5,936,953 | A | * | 8/1999 | Simmons | 370/364 |
| 5,970,052 | A | | 10/1999 | Lo et al. | |
| 6,058,492 | A | * | 5/2000 | Sample et al. | 714/33 |
| 6,073,194 | A | | 6/2000 | Lowe | |
| 6,078,545 | A | * | 6/2000 | Hirasawa | 365/230.08 |
| 6,222,407 | B1 | * | 4/2001 | Gregor | 327/269 |
| 6,239,616 | B1 | * | 5/2001 | Churcher et al. | 326/49 |
| 6,243,784 | B1 | * | 6/2001 | Anderson et al. | 713/401 |
| 6,286,118 | B1 | * | 9/2001 | Churchill et al. | 714/726 |
| 6,348,827 | B1 | * | 2/2002 | Fifield et al. | 327/278 |
| 6,378,092 | B1 | * | 4/2002 | Josephson | 714/724 |
| 6,397,354 | B1 | * | 5/2002 | Ertekin | 714/34 |
| 6,421,784 | B1 | * | 7/2002 | Chu et al. | 713/401 |

OTHER PUBLICATIONS

Walker, Peter A., et al., "On the nature and inadequacies of transport timing delay constructs in VHDL descriptions", IEEE Transactions on computer–aided design of integrated circuits and systems, vol. 16, No. 8, Aug. 1997, p.p. 894–915.
European Search Report dated Feb. 18, 2003, which issued in connection with counterpart foreign EPO application No. 01303720.5.

* cited by examiner

Primary Examiner—Albert DeCady
Assistant Examiner—Anthony T. Whittington (57) ABSTRACT

A method and apparatus are disclosed for verifying the functional design of a system's response to propagation delays from the inputs of source synchronous links during testing. The system emulates propagation delays by receiving data slice from a source, applying a random or known delay to the data slice, and sending the delayed data slice to the chip under test. In one embodiment, multiple data slices having varying delay values may be used to test combinations of delays. A programmable delay.element is used to emulate the propagation delays. This is may be implemented at the hardware description level by receiving the data slice onto multiple data buses, applying a different delay to the data slice on each data bus, and sending the delayed data slices as inputs into a multiplexor. The multiplexor may have a selector input that determines which amount of delay to test. Alternatively, the delay may be emulated using a higher level programming language and creating a multidimensional array. In one dimension, the array receives different data slices, and in the other it assigns different delay values. The multidimensional array then receives multiple data slices at the same time. Each delay value is stored in a different array location, depending upon the delay assigned to the data slice. An output entry is sent to the chip under test. The array entries may be shifted each clock cycle to the output entry, or a pointer may be used to specify a different output entry each clock cycle.

19 Claims, 10 Drawing Sheets

PROGRAMMABLE DELAY ELEMENTS FOR SOURCE SYNCHRONOUS LINK FUNCTION DESIGN VERIFICATION THROUGH SIMULATION

TECHNICAL FIELD

The technical field relates generally to computer architecture and more particularly, but not by way of limitation, to a method and apparatus for testing a simulated integrated circuit chip's response to input propagation delays by emulating delays throughout a tolerance range.

BACKGROUND

Elements or components of a circuit are electrically interconnected by links. For example, on a circuit board, integrated circuit (IC) chips may be connected using links, or cables. Data may be sent to a chip in a data slice, or bundle, along with a data strobe. The data strobe is used to indicate that the accompanying data is valid. The recipient latches the data as soon as it sees the strobe. The length of these links may create a propagation delay in the transfer of data, which creates a potential problem for the chip receiving the data. This is particularly a problem with synchronous links where the protocol allows a phase of a signal to cross a synchronous boundary.

A chip may be designed to recognize and properly respond to link delays within a certain, specified tolerance range. In order to ensure that the chip properly processes data from delayed source synchronous links, it is desirable to test the chip's response to these delays. In this testing process, the simulated chip under test is also referred to as the application specific integrated circuit (ASIC). The ASIC is simulated at the hardware description level, also called the register transfer level (RTL). In particular, it is desirable to verify the ASIC's response to source synchronous link delays throughout the entire tolerance range of delays in an efficient manner. Even more delay/slice combinations must be tested on those links with skew—that is, those links having multiple data slices. This is done to verify the functional design of the simulated chip.

Unfortunately, no means exists for efficiently testing the chip's response to link delays throughout the tolerance range or for multiple data slices. Existing methods of testing rely upon statically defined transport delays at the hardware description level (RTL). These methods are not efficient, because they require iteratively changing the delay values, recompiling, and running the system to exercise various delay lengths. This unnecessarily consumes CPU time, disk space, and user time. What is needed is an efficient means of verifying a chip's response to delays in source synchronous links throughout the tolerance range and in multiple combinations.

SUMMARY OF THE INVENTION

A method and apparatus are disclosed for verifying the functional design of a system's response to propagation delays from the inputs of source synchronous links during testing. The system emulates propagation delays by receiving data slice from a source, applying a random or known delay to the data slice, and sending the delayed data slice to the chip under test. In one embodiment, multiple data slices having varying delay values may be used to test combinations of delays.

A programmable delay element is used to emulate the propagation delays. This may be implemented at the hardware description level by receiving the data slice onto multiple data buses, applying a different delay to the data slice on each data bus, and sending the delayed data slices as inputs into a multiplexor. The multiplexor may have a selector input that determines which amount of delay to test. To test multiple data slices in combination, multiple multiplexors may be used.

In another embodiment, the delay may be emulated using a higher level programming language and creating a multi-dimensional array. In one dimension, the array receives different data slices, and in the other it assigns different delay values. The multidimensional array then receives multiple data slices at the same time. Each delay value is stored in a different array location, depending upon the delay assigned to the data slice. An output entry is sent to the chip under test. The array entries may be shifted each clock cycle to the output entry, or a pointer may be used to specify a different output entry each clock cycle.

SUMMARY OF THE DRAWINGS

FIGS. 7A through 7G show the progression of data slices through a matrix of a second implementation of the programmable delay element.

DETAILED DESCRIPTION

The method verifies a chip's functional design with respect to the processing of data slices from source synchronous links by emulating multiple delay values, individually and in combination. Programmable delay elements are placed into RTL or C language at the inputs of an RTL ASIC. By so doing, the ASIC(s) under test will see the delay. Because the RTL ASIC drives an ideal edge, the test environment receives only aligned data. The system may be implemented to test a bi-directional link by using a delay element for each direction. In a bi-directional test, the input of each delay element is connected to the output of the other. The delay elements have independent drive enables controlled by their respective sources.

Figure 1:
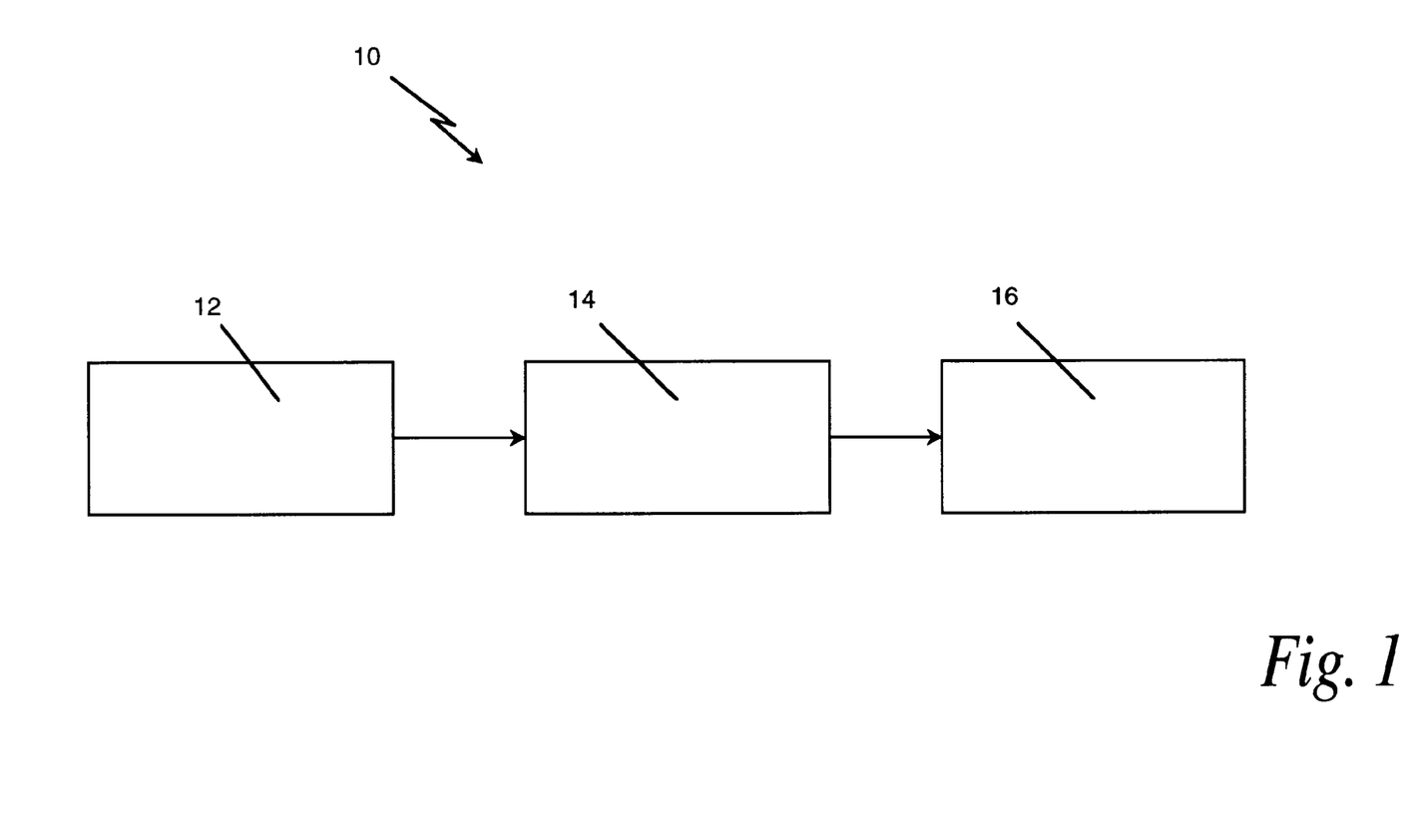
FIG. 1 is a block diagram of the system.

FIG. 1 shows a simplified block diagram of the system 10 for emulating the propagation delay of a link for the purpose of testing a chip. The system 10 includes a data source 12, which sends data and a data strobe to an ASIC under test 16. The data source 12 may be another ASIC or other system tools. The data and data strobe pass through a programmable delay element 14, which emulates the propagation delay on a link. The programmable delay element 14 receives data/strobe pair from the source 12, delays the data/strobe pair for a specified number of cycles, and then sends the data/strobe pair to the ASIC 16.

Figure 2:
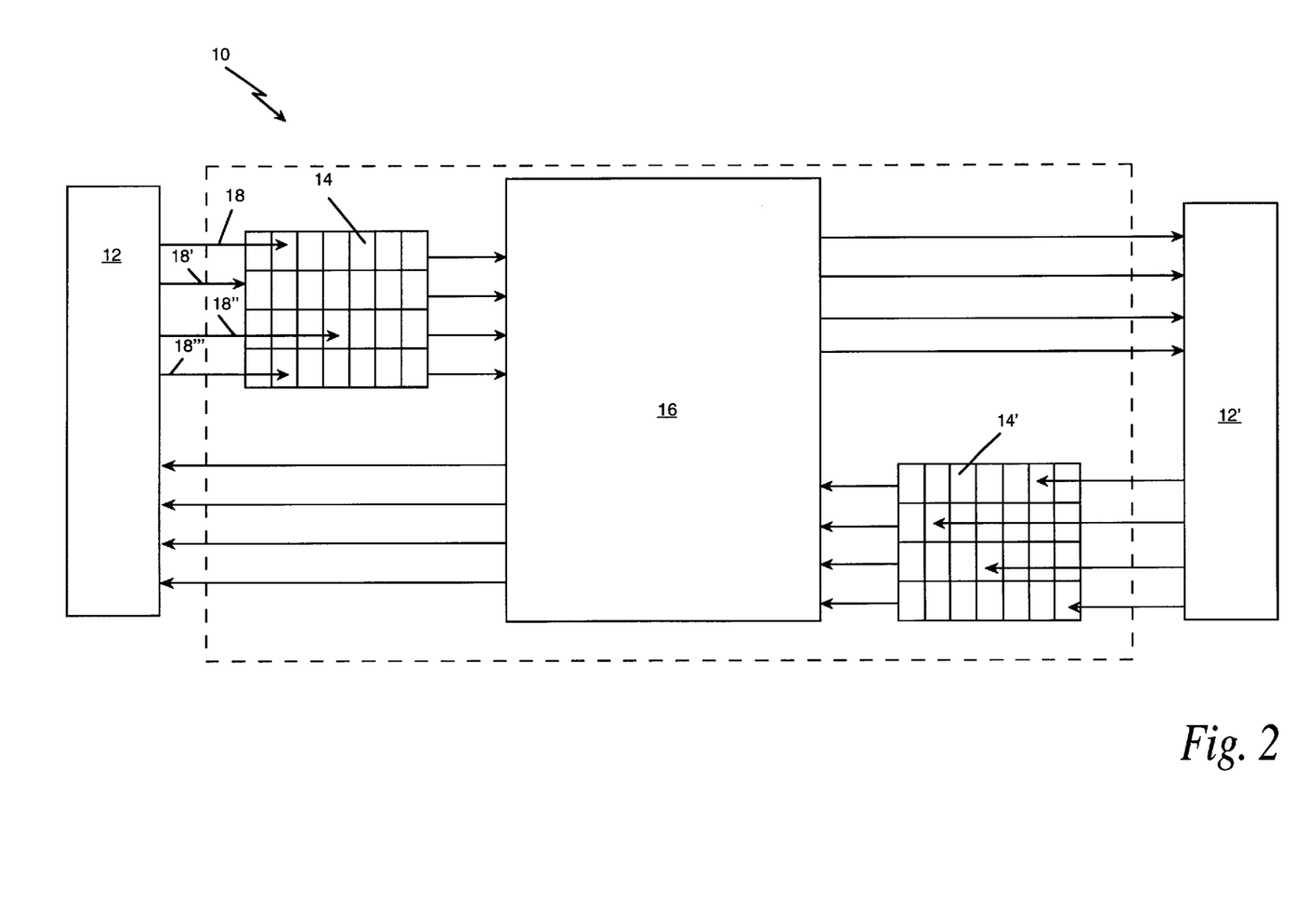
FIG. 2 is a more detailed block diagram of the system of FIG. 1.

FIG. 2 is a more detailed block diagram of a system 10 for testing an ASIC 16 having two input and two output ports on the left and right sides of the ASIC 16. The system 10 has a source 12 that sends a plurality of data slices 18 to the programmable delay element 14. The programmable delay element 14 delays the data slices 18 by varying numbers of cycles before sending the data slices 18 to the ASIC 16. In the implementation lo shown in FIG. 2, the ASIC 16 sends a response signal back to the source 12. As shown in FIG. 2, the ASIC 16 is being tested on two input ports on the left and right sides. In this configuration, a second source 12' is shown using a second programmable delay element 14'. In response to the testing applied to the right hand port, the ASIC 16 sends the response signal back to the second source 12'.

Figure 3:
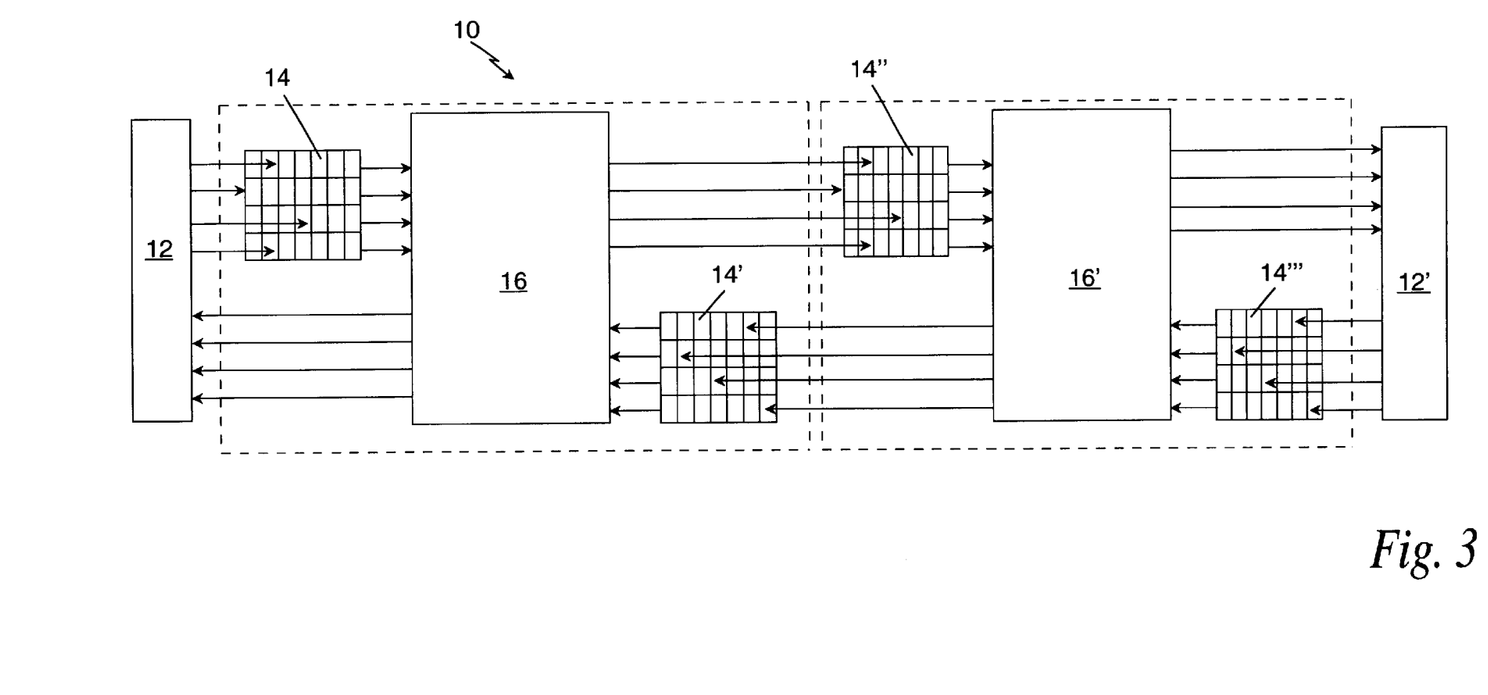
FIG. 3 is a block diagram of a system for testing more than one ASIC.

FIG. 3 shows another configuration of the system in which two ASICs 16, 16' are under test. Each ASIC 16, 16' is tested on two input ports. A separate programmable delay element 14, 14', 14", 14'" is used to emulate the propagation delay on each of the links. The output response signal from the first ASIC 16 is sent as an input to the second ASIC 16', showing that the source of data may be another ASIC 16.

Figure 4:
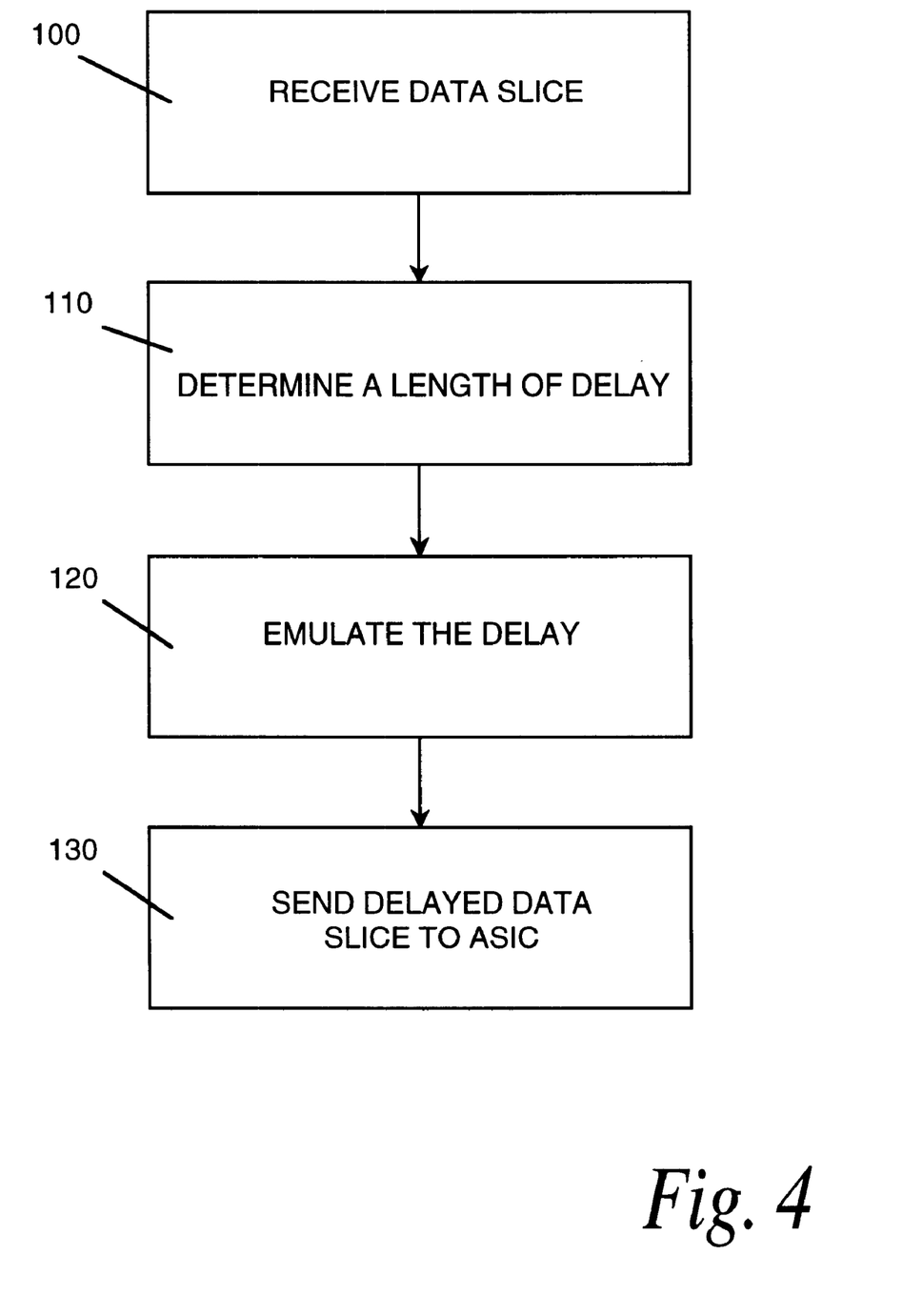
FIG. 4 is a flow chart of the method used by the system.

FIG. 4 shows a flow chart of the method used to emulate the propagation delay of the links. A data slice 18 is received 100 by a programmable delay element 14. A random or predetermined delay value is assigned 110 to the data slice 18. The programmable delay element emulates 120 the propagation delay, and then sends 130 the delayed data slice to the ASIC 16.

Figure 5:
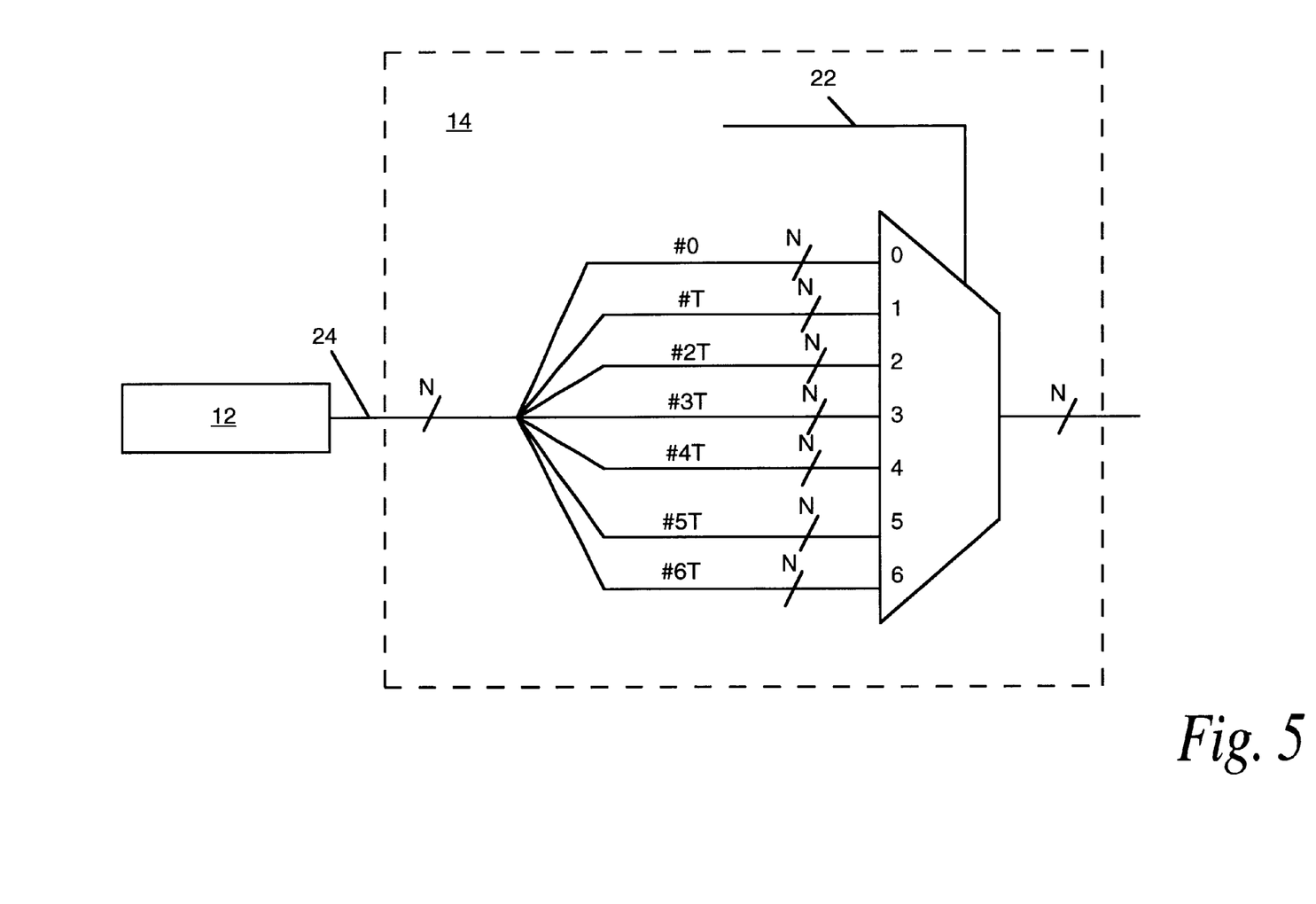
FIG. 5 is a block diagram showing a hardware description language implementation of the programmable delay element.

FIG. 5 illustrates the hardware that may be used in one implementation of the programmable delay element 14. In this configuration, the programmable delay element 14 is implemented using a transport delay in hardware description language. This implementation shows a source 12 sending a data slice along a bus 24. The bus 24 is split into multiple busses, each of which delays the data slice by a different number of cycles, ranging from zero cycles to 6 cycles in the embodiment shown in FIG. 5. The "#" symbols represent a delay element having a delay of the stated number of cycles. These delayed data slices are then input into a multiplexor 20. The output of the multiplexor 20 is a delayed data slice that is input into the ASIC 16. A selector 22 on the multiplexor 20 controls which input data slice is output, and thus controls the amount of delay on the data slice that is sent to the ASIC 16. In this implementation, the user may test combinations of multiple data slices 18 by using multiple multiplexors 20. As described above with respect to the matrix embodiment of the delay element 14, the ASIC 16 receives a plurality of data slices (e.g., 18, 18', 18", 18'" in FIG. 2) after delay values have been applied to the data slices by the matrix. The position of the data slices in the matrix determines the delay values for each of the slices. By changing the matrix positions of different data slices, different combinations of data slices having different delay values are sent to the ASIC 16, as described further herein. The embodiment of FIG. 5 uses a multiplexor to apply different delay values to a data slice carried on a bus 24. As with the matrix embodiment shown in FIG. 2, the multiplexor embodiment may also be used to send multiple delayed data slices to the ASIC 16. FIG. 5 shows the application of delays to one data slice on a bits 24. To send multiple delayed data slices to the ASIC 16, the separate data slices may be carried on separate buses 24 and a separate multiplexor may be used for each of the separate data slices to create the delays.

Figure 6:
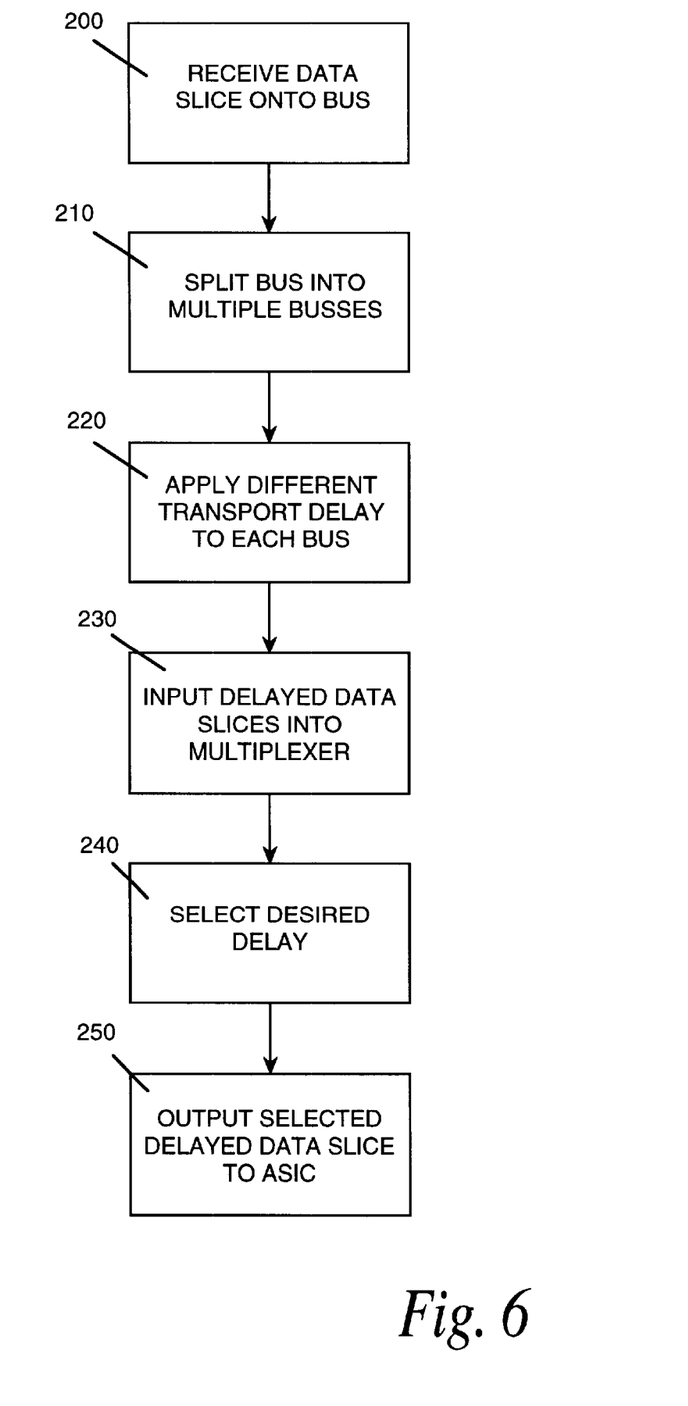
FIG. 6 is a flow chart of one implementation of the method.

FIG. 6 is a flow chart of the method implemented in hardware description language. The data slice 18 is received 200 from the source 12 onto a bus 24. The bus 24 is split 210 into a number of separate busses. A transport delay is then applied 220 to the data slice 18 carried by each separate bus. These delayed data slices are then input 230 into the multiplexor 20. The desired delay is selected 240 with the selector 22 on the multiplexor 20, which then outputs from the multiplexor 20 the data slice having the desired delay. This output is then sent 250 to the ASIC.

Figure 7A:
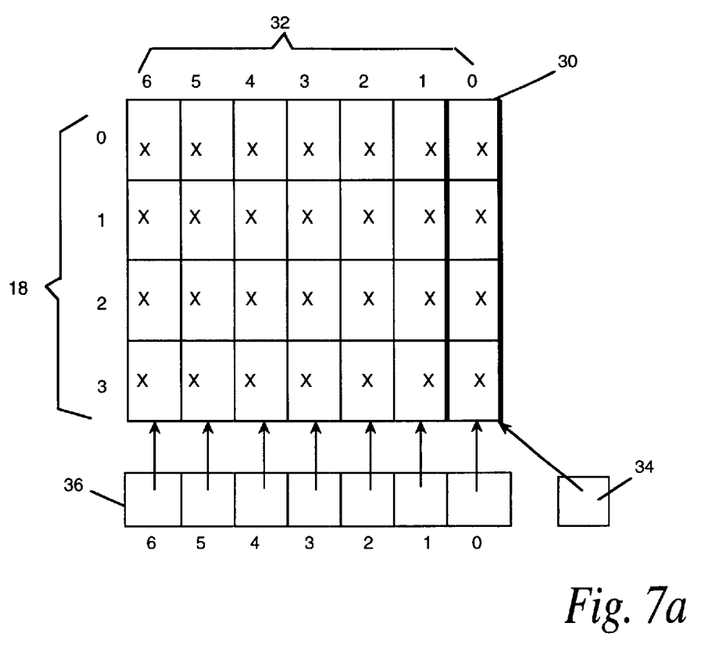

FIGS. 7A through 7G show another embodiment using a higher level software design, such as C programming language. This implementation of the programmable delay element creates an array 30, which stores the data slices 18. When the data slices 18 are input into the array 30, they are assigned different delay values 32, depending upon their location in the array 30. FIG. 7A shows a two-dimensional, 7×4 entry array 30. A multidimensional array 30 allows the programmable delay element to process multiple data slices 18 in desired combinations. The vertical axis represents different data inputs 18 to the array, and the horizontal axis represents different delay values 32. The horizontal position in the example shown in FIG. 7A has increasing delay values 32 moving right to left. That is, a data slice 18 in the right-most, "0" column has no delay attached to it, whereas a data slice 18 entered in the left-most "6" column has a delay of six cycles. The x's shown in FIG. 7A represent initial values of the array. The vertical section between the bold lines indicates the current output 34 of the delay element.

Figure 7B:
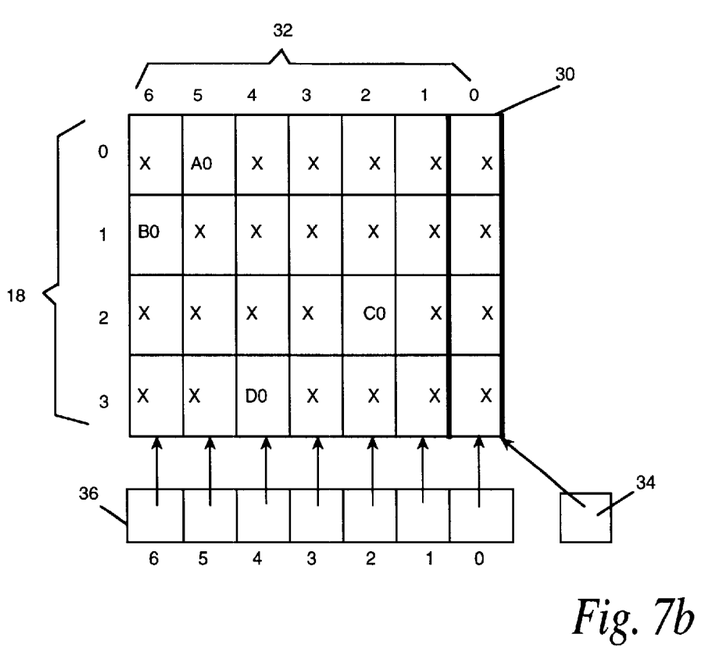

FIG. 7B shows the array 30 one clock cycle after the state shown by FIG. 7A. Four data slices A0, B0, C0, D0 are simultaneously entered into the array 30. These data slices 18 are entered within their respective, predetermined rows in varying horizontal positions representing different delay values 32. By way of example, the array 30 may be named "pipe" and the convention of a particular array location would be given by pipe[delay][slice]. Data slices 18 are entered into the array 30 in a first-in, first-out (FIFO) basis, such that, for example, in an array 30 having seven horizontal spaces, the eighth data slice will overwrite the first, the ninth will overwrite the second, etc.

Figure 7C:
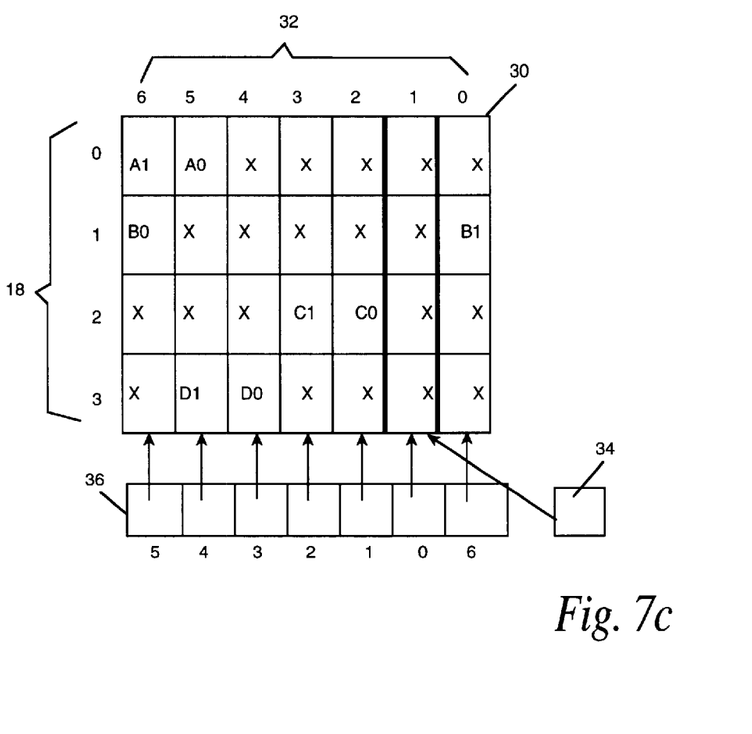
Figure 7D:
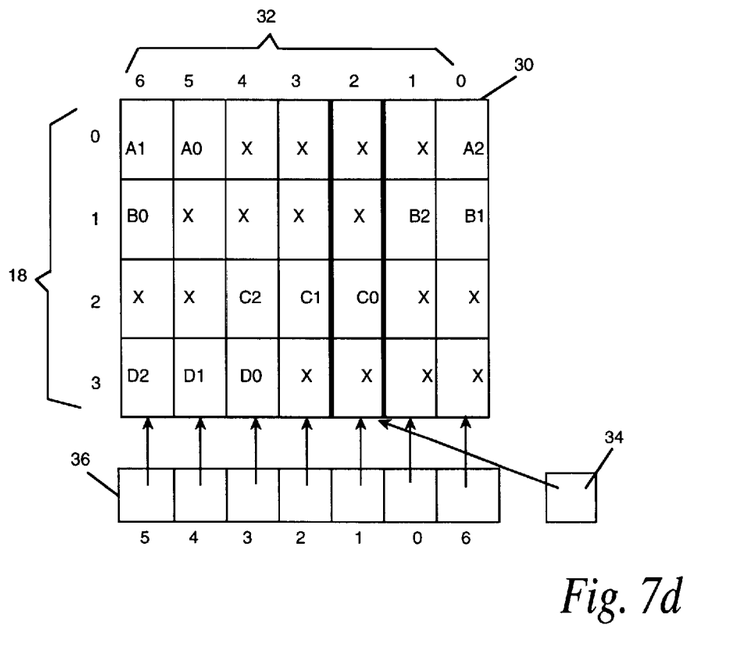
Figure 7E:
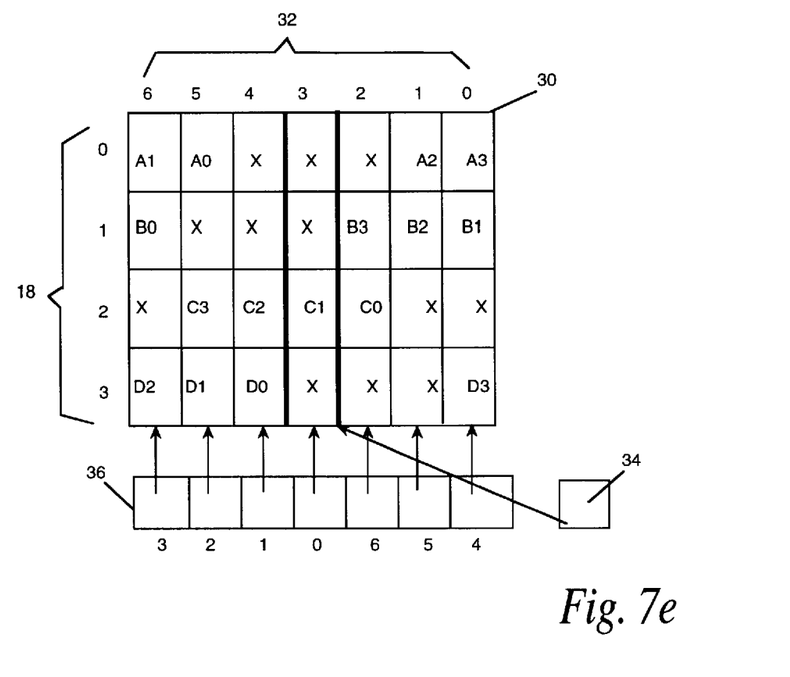
Figure 7F:
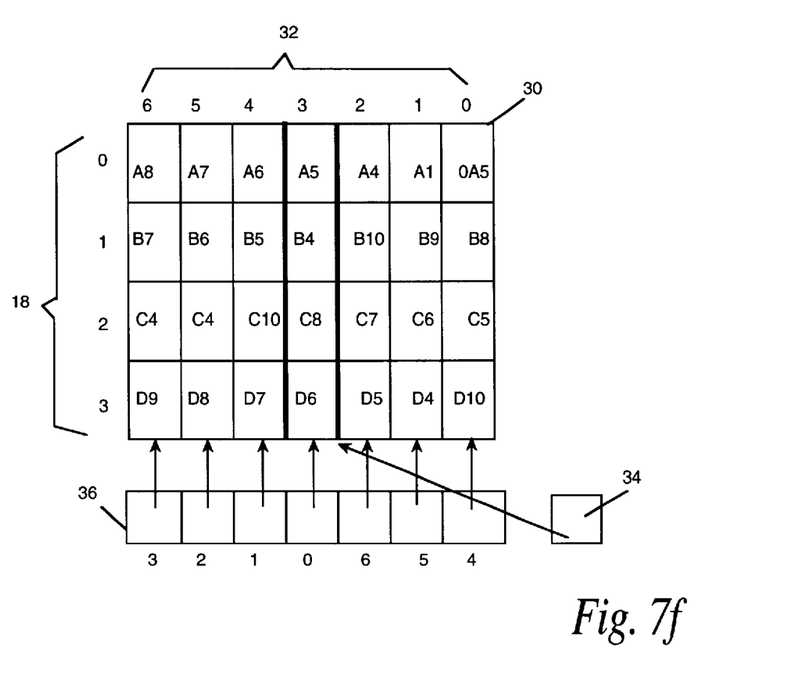

FIG. 7C shows the array 30 in the following clock cycle, in which data slices A1, B1, C1, D1 have been inserted into open spaces in the array 30. This addition of new data slices 18 continues for each slice during each cycle, as shown by FIGS. 7D and 7E. FIG. 7F shows the entries of the array during the tenth cycle.

Figure 7G:
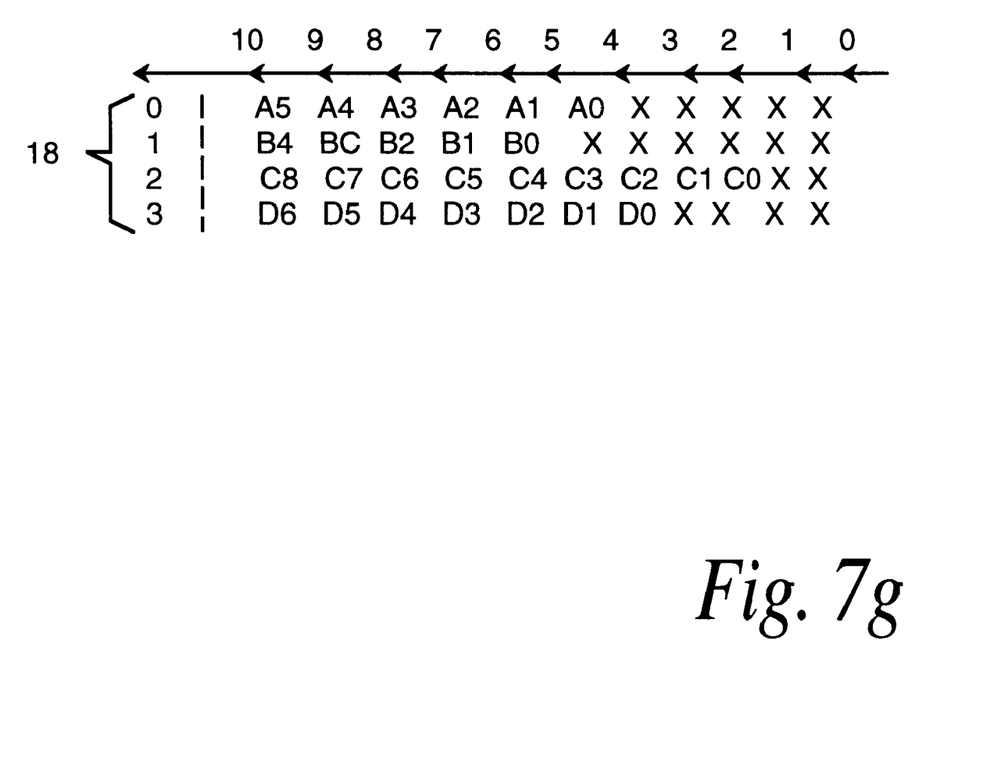

Also during each cycle, an output slice 34 is sent from the programmable delay element 14 to the ASIC 16. As shown by the system in FIGS. 7A through 7F, the output slice may contain a combination of data slices 18 having various delays 32. This may be implemented by shifting the data horizontally through the array 30 and reading out the right-most entry, which method is not shown. Alternatively, the output method may be implemented using pipe pointers 36 as shown in FIGS. 7A through 7G. After data slices 18 are entered into the array 30, the pipe pointers 36 shift to the left on the following clock cycle. The output slice 34 tracks the zero pipe pointer 36, as reflected by the bold lines in FIGS. 7A through 7F showing the output slice 34 at sequential clock cycles. FIG. 7G is a table showing the output slices 34 for the ten sequential clock cycles represented in FIGS. 7A through 7F.

The method can also be explained by the follow pseudo code:

```
    unsigned int * pipe[MAX_CXR_DELAY];    // Pointer to time slice arrays of
    pipe_reg.
    unsigned int * output_slice;           // Pointer to current output time
    slice array.
    unsigned int * input_slice;            // Pointer to input slice.
    unsigned int pipe_reg[MAX_CXR_DELAY][NUM_DATA_SLICES];
                                           // Data storage element
    int delay[NUM_DATA_SLICES];            // Delay values for each data slice.
    void cxr_delay::clock () {
    int i;
    unsigned int * temp;
    // The next several lines of code shift the pointer to each time slice in a circular
fashion.
    temp = pipe[0];
    for (i=0; i<max_delay; i++) {          // Shift pointers
       pipe[i] = pipe[i+1]
    }
    pipe[max_delay] = temp;
    // Data from the input pointer is placed into the pipe based on its delay. If a data
    slice has delay N, it will appear time pipe[0] (the output pointer) in N clock cycles.
    for (i=0; i<NUM_DATA_SLICES; i++) {
       pipe[delay[i]][i] = input_slice[i];
    }
    // Update pointer to current data driven from delay element.
    output_slice = pipe[0];
    }
```

By using programmable delay elements, delay values can be determined from inputs to the environment and set at run-time. This provides greater efficiency than existing methods, because recompilation is not required. By using a pseudo-random number generator to generate delay values throughout the tolerance range, greater coverage is obtained.

Although the present invention has been described in detail with reference to certain embodiments thereof, variations are possible. The present invention may be embodied in other specific forms without departing from the essential spirit or attributes thereof. It is desired that the embodiments described herein be considered in all respects as illustrative, not restrictive, and that reference be made to the appended claims for determining the scope of the invention.

What is claimed is:

1. A method for verifying the functional design of a simulated chip receiving data from a link comprising:
   receiving at a programmable delay element a data slice from a source;
   emulating a link delay in a source synchronous link using the programmable delay element to delay sending the data slice; and
   sending a delayed data slice to the simulated chip under test, wherein the chip is simulated at a hardware description level.

2. The method of claim 1, wherein the programmable delay element comprises a multiplexor capable of receiving a plurality of data slices having different amounts of delay, said multiplexor having a selector input for selecting the desired link delay.

3. The method of claim 1, wherein the step of emulating comprises:
   assigning the received data slice a delay value;
   storing the received data slice in an array in a location determined by its assigned delay value; and
   waiting for the duration of the delay value.

4. The method of claim 3, wherein the array is capable of holding a plurality of separate received data slices having various assigned delay values.

5. The method of claim 4, wherein the step of emulating further comprises:
   using a pointer to track the state of the array on each clock cycle;
   advancing the pointer each clock cycle;
   writing the data slice to an array entry based upon the location of the pointer; and
   wherein the data slice is sent to the simulated chip under test when the data slice is in an output entry determined by the location of the pointer.

6. A method of emulating a propagation delay in a link for verifying the functional design of a simulated chip under test comprising:
   receiving a data slice;
   applying a delay value to the data slice, wherein said delay value is selected at random within a certain tolerance range and is assigned to the data slice using a computer hardware description language; and
   sending the delayed data slice to the simulated chip under test.

7. The method of claim 6, wherein the delay value is applied using a programmable delay element comprising an array having entries corresponding to delay values within the certain tolerance range.

8. The method of claim 7, wherein the array is a multi-dimensional array that receives a plurality of data slices and holds the plurality of data slices in separate array entries corresponding to separate time delays.

9. A system for verifying the functional design of a simulated chip receiving data from a link comprising:
   a data source that sends test data slices; and
   a programmable delay element that receives a data slice from the source, applies a time delay to the data slice to emulate a source synchronous link, and sends the delayed data slice to a simulated chip under test, wherein the chip is simulated at a hardware description level, and wherein the time delay may be selected from a range.

10. The system of claim 9, wherein the programmable delay element receives and processes a plurality of data slices from the source.

11. The system of claim 9, wherein the programmable delay element further comprises:
   a source bus that receives a data slice from the source;
   a plurality of delay buses connected to the source bus; and a plurality of delay elements that apply a different delay to the data slice on each of the delay buses to create a plurality of delayed data slices.

12. The system of claim 11, wherein the programmable delay element further comprises a multiplexor that receives the plurality of delayed data slices and outputs a data slice having a selected delay.

13. The system of claim 12, wherein the programmable delay element comprises an array that inserts the received data slice into an entry in the array corresponding to the length of the delay, and wherein the data slice is removed from the array and sent to the simulated chip under test.

14. The system of claim 13, wherein the array is a multidimensional array that receives a plurality of data slices and inserts the plurality of data slices into entries corresponding to lengths of delays for each data slice.

15. The system of claim 14, further comprising a pointer for tracking the state of the array on each clock cycle.

16. The method of claim 3, wherein the step of storing in the array comprises storing in a multidimensional array embodied in software, the array having a first dimension that specifies data values and a second dimension that specifies delay times.

17. The method of claim 3,
wherein the array receives a plurality of data bits from the source, assigns a delay value to each of the data bits based on locations in the array, wherein data bits having common delay values form data slices, and wherein the step of sending the delayed data slice comprises sending the data slice when a pointer points to the data slice, wherein the pointer advances through the data slices in the array on sequential clock cycles.

18. The method of claim 17, further comprising randomly positioning the data bits in the array to create different combinations of data bits to form the data slices.

19. The method of claim 6,
wherein the step of receiving comprises receiving the data slice on a bus, further comprising splitting the bus into a plurality of buses, wherein each of the busses receives the data slice, wherein the step of applying the delay comprises applying a different delay to each of the plurality of buses, further comprising:
receiving the delayed data slices at inputs to a multiplexor, and
selecting one of the delayed data slices; and wherein the step of sending comprises sending the selected data slices.

* * * * *